(12) United States Patent
Shimakura et al.

(10) Patent No.: US 9,773,640 B2
(45) Date of Patent: Sep. 26, 2017

(54) SAMPLE HOLDER, CHARGED PARTICLE BEAM APPARATUS, AND OBSERVATION METHOD

(71) Applicant: Hitachi, Ltd., Chiyoda-ku, Tokyo (JP)

(72) Inventors: Tomokazu Shimakura, Tokyo (JP); Yoshio Takahashi, Tokyo (JP); Hideo Kashima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 56 days.

(21) Appl. No.: 14/810,673

(22) Filed: Jul. 28, 2015

(65) Prior Publication Data

US 2016/0035535 A1    Feb. 4, 2016

(30) Foreign Application Priority Data

Jul. 28, 2014  (JP) ................................ 2014-152939

(51) Int. Cl.
*G21K 5/10*     (2006.01)
*H01J 37/20*    (2006.01)

(52) U.S. Cl.
CPC ..... *H01J 37/20* (2013.01); *H01J 2237/20214* (2013.01)

(58) Field of Classification Search
CPC .. H01J 37/00; H01J 37/02; H01J 37/20; H01J 2235/087
USPC .............. 250/306, 307, 311, 440.11, 442.11
See application file for complete search history.

(56) References Cited

U.S. PATENT DOCUMENTS

| 2008/0099695 A1* | 5/2008 | Sugizaki | G01N 1/32 250/492.1 |
| 2010/0230584 A1* | 9/2010 | Niebel | H01J 37/153 250/252.1 |
| 2012/0112064 A1* | 5/2012 | Nagakubo | G01N 1/286 250/307 |

(Continued)

FOREIGN PATENT DOCUMENTS

| JP | 2013-149507 A | 8/2013 |
| WO | WO 2013/108711 A1 | 7/2013 |

OTHER PUBLICATIONS

Phatak, C., et al.; "Vector field electron tomography of magnetic materials: Theoretical development", vol. 108, (2008), 503-513.

*Primary Examiner* — Jason McCormack
(74) *Attorney, Agent, or Firm* — Mile & Stockbridge P.C.

(57) ABSTRACT

An object of the present invention is to provide a sample holder that can carry out a series of observations in which a rotational series image at arbitrary angles, namely, from −180° to +180° around the x-axis of an observation region and a rotational series image at arbitrary angles, namely, from −180° to +180° around the y-axis are obtained without taking a sample out of a sample chamber.
A sample holder includes a power unit, a power separator, a rotational movement transmission mechanism, and a linear movement transmission mechanism. The power separator separates one movement of the power unit to be distributed to the rotational movement transmission mechanism and the linear movement transmission mechanism. The rotational movement transmission mechanism provides a rotational movement around a second rotational axis. The linear movement transmission mechanism provides a linear movement around the second rotational axis.

10 Claims, 15 Drawing Sheets

(56) References Cited

U.S. PATENT DOCUMENTS

2012/0119109 A1* 5/2012 Kim .................. H01J 37/20
                                                                                 250/442.11
2014/0353500 A1* 12/2014 Tsuneta .................. H01J 37/20
                                                                                  250/311

* cited by examiner

SAMPLE HOLDER, CHARGED PARTICLE BEAM APPARATUS, AND OBSERVATION METHOD

CLAIM OF PRIORITY

The present application claims priority from Japanese patent application JP2014-152939 filed on Jul. 28, 2014, the content of which is hereby incorporated by reference into this application.

BACKGROUND

The present invention relates to a sample holder, a charged particle beam apparatus, and an observation method.

Vector field tomography described in "Ultramicroscopy, Vol. 108, (2008) 503-513, C. Phatak, M. Beleggia and M. De Graef" is a technique for three-dimensionally analyzing an electromagnetic field structure of a sample using an image by a transmission electron microscope. The literature describes that in order to reconfigure vector components (x, y, z) of an electromagnetic field, a rotational series image at arbitrary angles, namely, from −180° to +180° around the x-axis of an observation region and a rotational series image at arbitrary angles, namely, from −180° to +180° around the y-axis are needed.

Japanese Unexamined Patent Application Publication No. 2013-149507 or WO2013/108711 relevant to Japanese Unexamined Patent Application Publication No. 2013-149507 describes a sample holder for an electron beam interference microscope and the like that can observe the rotational series image around the x-axis and the rotational series image around the y-axis. Japanese Unexamined Patent Application Publication No. 2013-149507 or WO2013/108711 describes "provided are: a sample mounting base having a mounting part to a tip end part of which a sample is mounted; a rotational jig having a mounting base holding part that holds the sample mounting base; a sample holding rod having a holding part that holds the rotational jig; a first rotation control part that provides the sample holding rod with a first rotation from −180° to +180° using the extending direction of the holding rod as an axis; and a second rotation control part that provides the rotational jig with a second rotation of ±45° or larger using the direction orthogonal to the rotational axis of the first rotation as an axis, and the sample mounting base is formed in a conical shape or a polygonal pyramidal shape" (see [0015]).

SUMMARY

In the technique described in Japanese Unexamined Patent Application Publication No. 2013-149507 or WO2013/108711, when the sample is rotated around a second rotational axis, the sample is separated from a first rotational axis. Accordingly, a slide jig is added, and a mechanism of returning the sample onto the first rotational axis is provided (see [0028]). The sample can be rotated around the second rotational axis using a wire, a slide rod, and a linear actuator in a sample chamber. However, the sample needs to be returned onto the first rotational axis using the slide jig outside the sample chamber (see [0037]). In order to return the sample onto the first rotational axis using the slide jig in the sample chamber, an additional space to provide a transfer mechanism for the slide jig is necessary in the sample holder. In order to secure the additional space, the parts need to be downsized or the size of the sample holder needs to be increased. However, it is difficult to realize the additional space because it is difficult to process the parts and the specification of a transmission electron microscope on which the holder is mounted is changed.

An object of the present invention is to provide a sample holder that can carry out a series of operations in which a rotational series image at arbitrary angles, namely, from −180° to +180° around the x-axis of an observation region and a rotational series image at arbitrary angles, namely, from −180° to +180° around the y-axis are obtained without taking a sample out of a sample chamber.

The following is a representative simplified summary of the present application.

Specifically, the present invention provides a sample holder including: a first rotational jig to a tip end part of which a charged-particle-beam-irradiated sample is attached; a power separator that separates one input movement into two movements; a holding rod that holds the power separator; a linear movement transmission mechanism that transmits power generated from the power separator and provides the first rotational jig with a linear movement; a rotational movement transmission mechanism that transmits the power generated from the power separator and provides the first rotational jig with a rotational movement; a power unit that provides the power separator with a movement; and a first rotation control unit that provides the first rotational jig with a first rotation using the extending direction of the holding rod as a rotational axis.

According to the sample holder, it is possible to carry out a series of operations in which a rotational series image at arbitrary angles around the x-axis of an observation region and a rotational series image at arbitrary angles around the y-axis are obtained without taking a sample out of a sample chamber.

BRIEF DESCRIPTION OF THE DRAWINGS

FIGS. 2A and 2B are top views each showing a sample holder according to a first embodiment, in which FIG. 2A shows arrangements of respective parts when a rotational series image of the sample around the x-axis is photographed and FIG. 2B shows arrangements of respective parts when a rotational series image of the sample around the y-axis is photographed;

DESCRIPTION OF THE PREFERRED EMBODIMENTS

Figure 1:
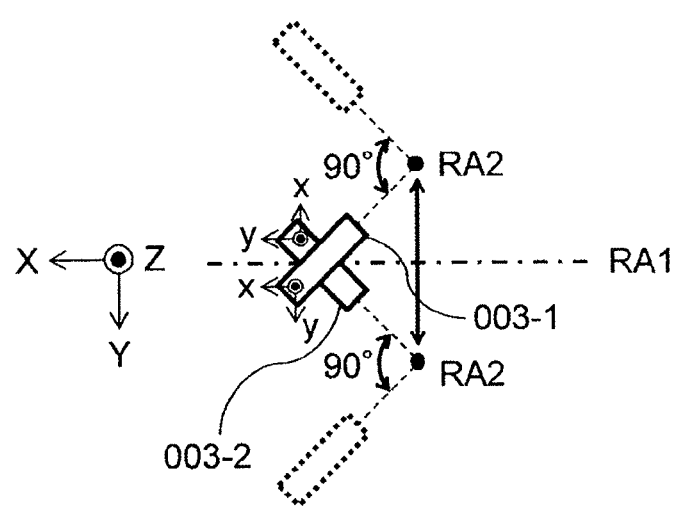
FIG. 1 is a conceptual diagram for explaining the movement of a sample.

Hereinafter, embodiments will be described using the drawings. However, the same constitutional elements are given the same reference numerals in the following description, and the explanation will not be occasionally repeated. It should be noted that in order to describe the present invention more clearly, the width, thickness, shape, and the like of each constitutional element will be schematically shown in the drawings in some cases as compared to an actual mode. However, these are just an example, and do not limit the interpretation of the present invention.

A state of a sample when a rotational series image around the x-axis of an observation region and a rotational series image around the y-axis of the observation region are obtained will be described using FIG. 1. FIG. 1 is a conceptual diagram for showing a relation among a sample, a first rotational axis, and a second rotational axis.

In order to obtain the rotational series image around the x-axis of the observation region, the sample is set in the state of a sample 003-1. In this state, the sample 003-1 is rotated from −180° to +180° around a first rotational axis RA1 to obtain the rotational series image around the x-axis of the observation region. It should be noted that the sample 003-1 is the same as a sample 003-2 to be described later. However, different reference numerals are given in FIG. 1 in order to explain the movement of the sample. When an explanation irrelevant to the movement of the sample is made, "003" is used as the reference numeral of the sample. Further, "003" is used as the reference numeral of the sample in FIG. 2 and the following drawings.

Next, the sample 003-1 is rotated clockwise around a second rotational axis RA2 by 90°, and the second rotational axis RA2 is slid to the position (Y-axis direction) line-symmetric with respect to the first rotational axis RA1. In the state of the sample 003-2, the rotational series image around the y-axis of the observation region is obtained. It should be noted that the observation region has a size enough to store, at least, both of the entire sample 003-1 and sample 003-2. When the sample 003-1 is rotated, the sample 003-1 is moved out of the observation region. Thus, the sample 003-1 is slid to be stored in the observation region.

In this case, the sample 003 is formed in a columnar shape (rod shape), and a coordinate xyz fixed to the sample 003 is set in such a manner that an angle formed by the long axis of the column and the x-axis is −45°, an angle formed by the long axis of the column and the y-axis is +45°, and an angle formed by the long axis of the column and the z-axis is a right angle (the same applies in the following embodiments). An angle formed by the long axis of the column of the sample 003-1 and the first rotational axis RA1 is set to be +45°, and an angle formed by the long axis of the column of the sample 003-2 and the first rotational axis RA1 is set to be −45° (the same applies in the following embodiments). Further, a coordinate system XYZ fixed to a housing is set in such a manner that the incident direction of a charged particle beam is −Z direction (the same applies in the following embodiments). The first rotational axis RA1 is parallel to the X-axis, and the second rotational axis RA2 is parallel to the Z-axis. It should be noted that the second rotational axis RA2 may be slid to the position line-symmetric with respect to the first rotational axis RA1, and the sample 003-1 may be rotated clockwise by 90° around the second rotational axis RA2. Further, the rotation of the sample 003-1 around the second rotational axis RA2 and the slide of the second rotational axis RA2 to the position (Y-axis direction) line-symmetric with respect to the first rotational axis RA1 may be carried out in parallel.

Specifically, in order to transit from the sample state of the rotational series image around the x-axis of the observation region to the sample state of the rotational series image around the y-axis of the observation region, a rotational movement around the second rotational axis RA2 and the slide along the second rotational axis RA2, namely, a linear movement are necessary.

Figure 14:
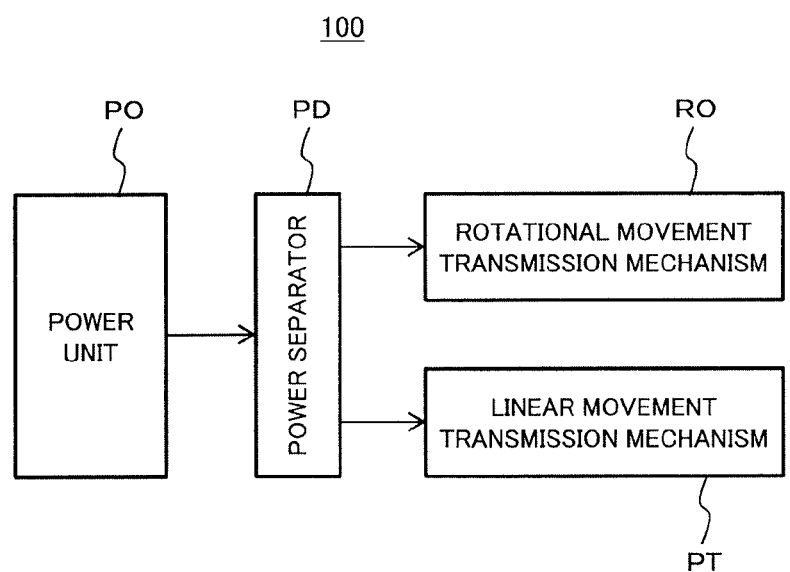
FIG. 14 is a diagram for explaining a sample holder according to an embodiment.

In order to realize the above-described operation, one movement is introduced to a sample holder according to the embodiment, and two movements of the rotational movement around the second rotational axis and the linear movement along the second rotational axis are generated using a power separator incorporated in the sample holder. FIG. 14 is a diagram for explaining the sample holder according to the embodiment. A sample holder 100 includes a power unit PO, a power separator PD, a rotational movement transmission mechanism PO, and a linear movement transmission mechanism PT. The power separator PD separates one movement of the power unit PO to be distributed to the rotational movement transmission mechanism PO and the linear movement transmission mechanism PT. The rotational movement transmission mechanism PO provides the rotational movement around the second rotational axis. The linear movement transmission mechanism PT provides the linear movement along the second rotational axis.

First Embodiment

Figure 2A:
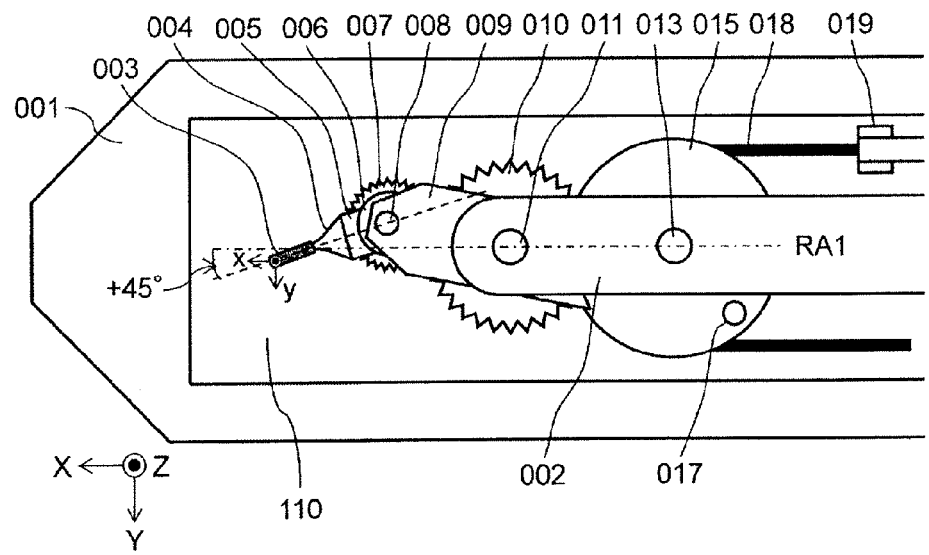
Figure 2B:
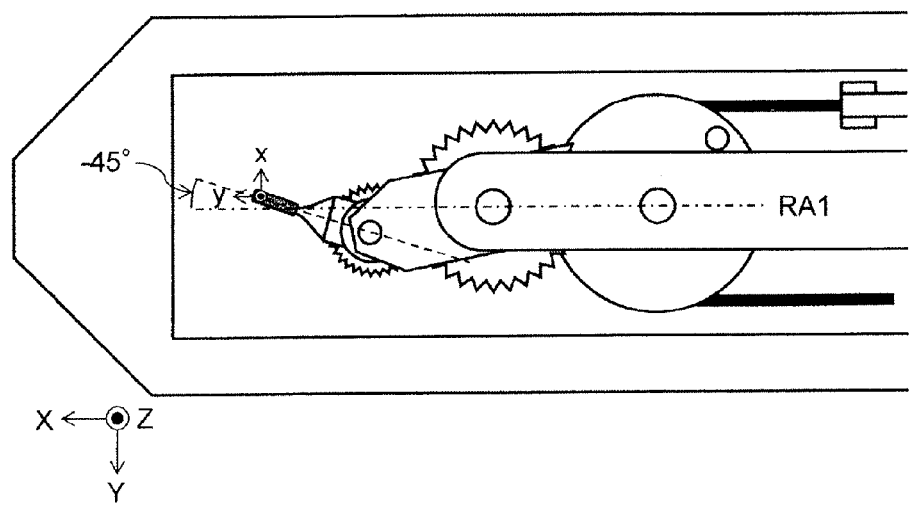
Figure 3:
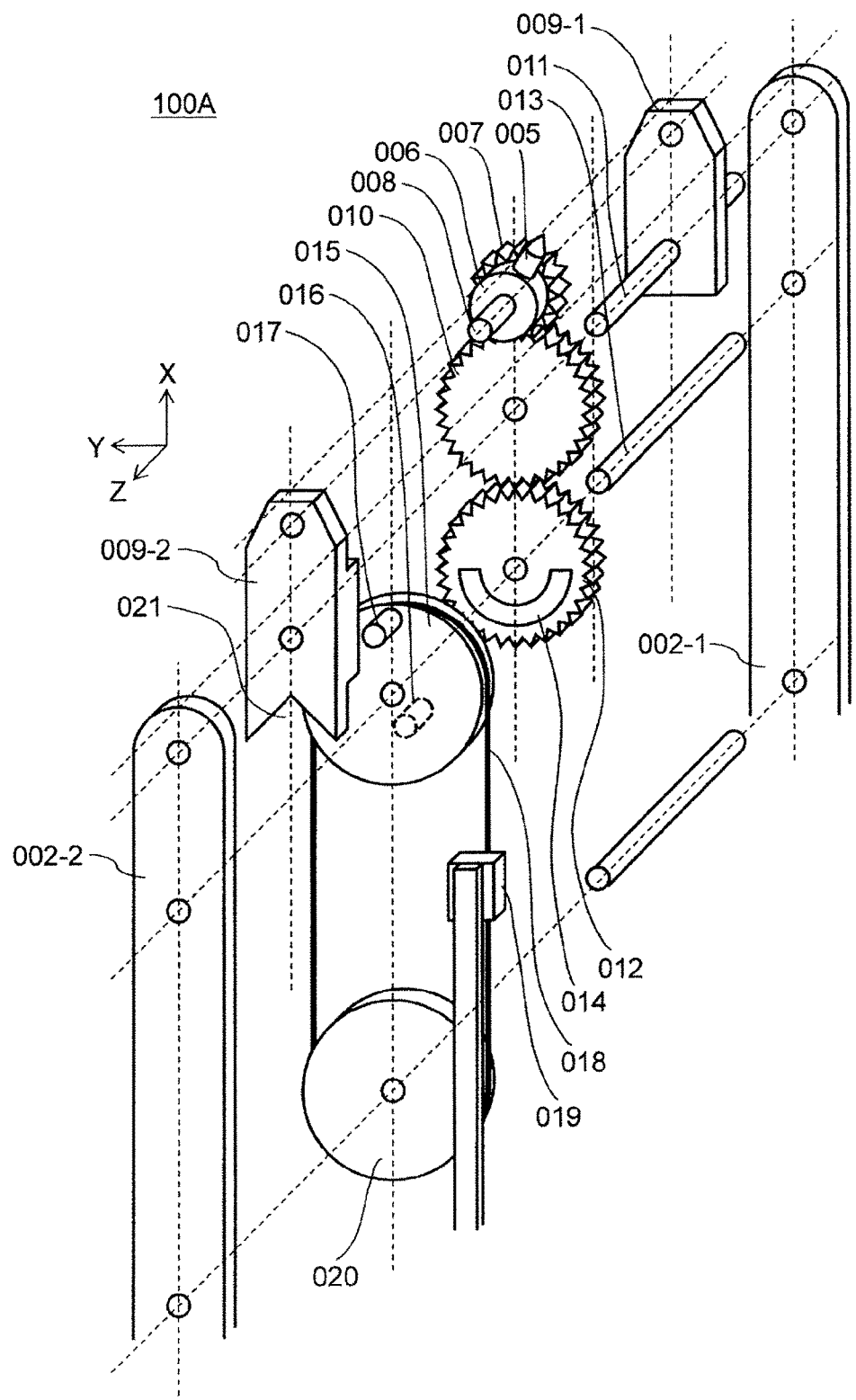
FIG. 3 is a configuration diagram of a tip end part of the sample holder according to the first embodiment.

A first embodiment of a sample holder will be described using FIGS. 2A to 4D. FIGS. 2A and 2B are top views each showing a tip end part of the sample holder according to the first embodiment. FIG. 2A shows an example of a state of the sample holder when the rotational series image around the x-axis of the observation region is obtained, and FIG. 2B shows an example of a state of the sample holder when the rotational series image around the y-axis of the observation region is obtained. The sample 003 is rotated by 90° between FIG. 2A and FIG. 2B. FIG. 3 shows a configuration diagram of the tip end part of the sample holder according to the first embodiment. A holding cylinder 001 and the sample 003 are not illustrated in FIG. 3.

A sample holder 100A according to the first embodiment includes a holding cylinder 001, a holding rod 002 disposed inside the holding cylinder 001, a second rotational jig 009 disposed at a tip end of the holding rod 002, a first rotational jig 006 disposed at a tip end of the second rotational jig 009, a needle stage holder 005 that installs the sample at the outer circumference of the first rotational jig 006, and a needle stage 004. When a tip end of the sample holder 100A is inserted into a sample chamber (vacuum vessel) of a charged particle beam apparatus such as a transmission electron microscope, the holding cylinder 001 is brought into contact with a sample holder transfer mechanism mounted in the charged particle beam apparatus. It should be noted that the insertion direction of the sample holder 100A is set in the X direction. The holding cylinder 001 is provided with an opening part 110 through which a charged particle beam passes, and the sample 003 is installed at the opening part 110. The sample holder 100A sets the position and angle of the sample relative to the charged particle beam. The first rotational axis RA1 is parallel to the X direction, and the irradiation axis of the charged particle beam is parallel to the Z direction. Thus, the first rotational axis RA1 is perpendicular to the irradiation axis of the charged particle beam. It should be noted that as the size of the sample 003, for example, the diameter is about 100 to 300 nm and the length is about 1 to 5 μm. The diameter of the sample 003 may be small as long as a transmission image can be obtained. The width (the length in the Y direction) of the sample holder 100A is, for example, about 7 mm, and the width (the length in the Y direction) of the opening part 110 is, for example, about 4 mm.

The holding rod 002 can be rotated independently from the holding cylinder 001 from −180° to +180° around the first rotational axis RA1 in the holding cylinder 001. As a first rotation control unit (not shown) that controls the rotation of the holding rod 002, for example, a pulse motor that rotates the holding rod 002 is used. The first rotation control unit is preferably disposed outside (under ordinary pressure) the sample chamber. Further, the first rotational jig 006 can be rotated at least by 90° around the second rotational axis RA2 orthogonal to the first rotational axis RA1 in the holding cylinder 001.

The sample 003 is installed at a tip end part of the needle stage 004. The needle stage 004 is inserted into the needle stage holder 005, and is detachable using tweezers and the like. The needle stage holder 005 is fixed to the first rotational jig 006. The first rotational jig 006 and a first gear 007 are fixed to each other. When the first rotational jig 006 is rotated with a first gear shaft 008 as a rotational axis, the first gear 007 is similarly rotated.

The embodiment shows an example in the case where the linear movement is introduced to the sample holder as power to move the sample 003. A slide rod 019 is linearly moved in the extending direction (X direction). A wire 018 is connected to a first pulley 015. A part of the wire 018 is fixed to the slide rod 019, and the linear movement of the slide rod 019 rotates the first pulley (rotor) 015. The slide rod 019 is moved using, for example, a linear actuator (not shown). The linear actuator is preferably disposed outside (under ordinary pressure) the sample chamber. The wire 018 and the slide rod 019 correspond to the power unit PO.

The first pulley 015 and a third gear 012 are installed in the holding rod 002, and can be rotated with a third gear shaft 013 as a rotational axis. The holding rod 002 is divided into plural parts 002-1 and 002-2 that sandwich the first pulley 015, the third gear 012, and the like from the both sides. The first pulley 015 is provided with a first pin 016 attached to the lower side (first surface) of the rotational surface and a second pin 017 attached to the upper side (second surface). It should be noted that +Z corresponds to the upper direction and −Z corresponds to the lower direction (the same applies in the following description). The first pulley 015, the first pin 016, and the second pin 017 correspond to the power separator PD. The rotation of the first pulley 015 is separated into the rotational movement and the linear movement of the first rotational jig 006 using the rotational movement transmission mechanism. RO connected to the first pin 016 and the linear movement transmission mechanism PT connected to the second pin 017.

The third gear 012 includes a first pin traveling long hole 014, and the first pin 016 is inserted into the first pin traveling long hole 014. The rotation of the first pulley 015 rotates the first pin 016. When the first pin 016 is brought into contact with an end part of the first pin traveling long hole 014, the third gear 012 is rotated together with the first pulley 015. When the first pin 016 is not brought into contact with the end part of the first pin traveling long hole 014, the rotation of the first pulley 015 is not transmitted to the third gear 012.

A second gear 010 can be rotated with a second gear shaft 011 as a rotational axis. The rotation of the third gear 012 is transmitted to the second gear 010, and is further transmitted to the first gear 007.

Since the first gear 007 is fixed to the first rotational jig 006 to which the sample 003 is attached, the rotation of the first pin 016 leads the rotation of the first rotational jig 006. A series of mechanisms up to rotating the first rotational jig 006 with the power separated by the first pin 016 that is a part of the power separator PD corresponds to the rotational movement transmission mechanism RO. Further, the rotation of the first rotational jig 006 corresponds to the rotational movement around the second rotational axis RA2 shown in FIG. 1. Specifically, the first gear shaft 008 corresponds to the second rotational axis RA2.

The second rotational jig 009 is divided into plural parts 009-1 and 009-2 that sandwich the first rotational jig 006 and the like. The part 009-2 of the second rotational jig 009 is provided with a V-shaped groove 021, so that the second pin 017 can be inserted into the V-shaped groove. When the rotation of the first pulley 015 rotates the second pin 017 and the second pin 017 is brought into contact with the V-shaped groove 021, the second rotational jig 009 is pushed by the second pin 017 and is rotated with the second gear shaft 011 as a rotational axis. When the second pin 017 is separated from the V-shaped groove 021, the rotation of the second rotational jig 009 stops.

The first rotational jig 006 is installed at an end part of the second rotational jig 009 opposite to the V-shaped groove 021. When the second rotational jig 009 is rotated by the second pin 017, the first rotational jig 006 is slid in the Y direction. A series of mechanisms up to sliding the first rotational jig 006 with the power separated by the second pin 017 that is a part of the power separator PD corresponds to the linear movement transmission mechanism PT. Further, the slide of the first rotational jig 006 corresponds to the linear movement of the second rotational axis shown in FIG. 1.

Each timing of the rotation of the first rotational jig 006 and the slide of the first rotational jig 006 can be determined on the basis of the arrangements of the first pin 016 and the second pin 017 on the first pulley 015 and the length of the first pin traveling long hole 014.

Figure 4A:
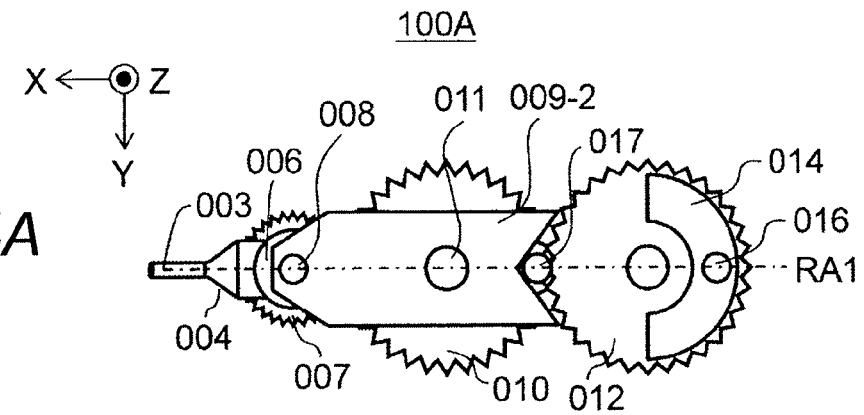
FIGS. 4A to 4D are explanatory diagrams each showing the movement of each part of the sample holder according to the first embodiment.
Figure 4B:
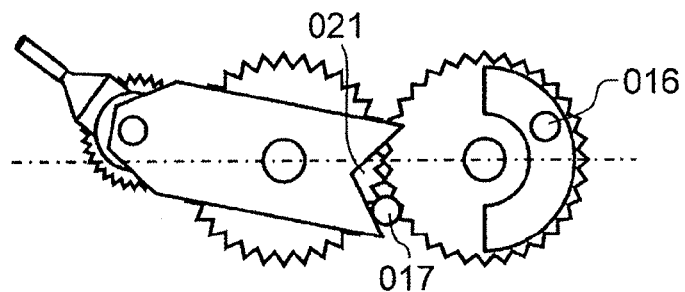
Figure 4C:
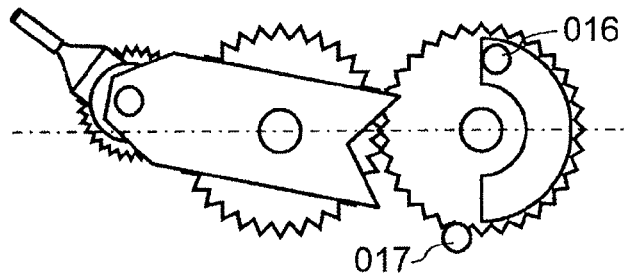
Figure 4D:
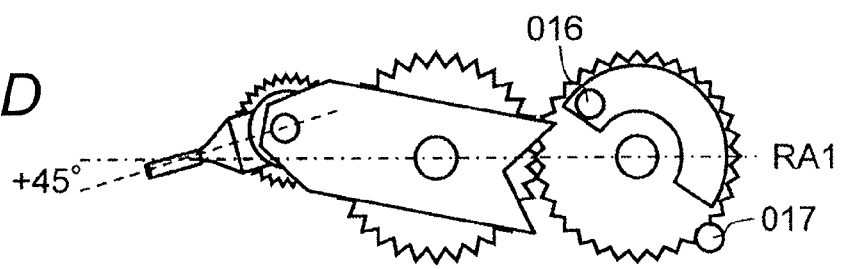

The movement of each part will be described using FIGS. 4A to 4D and FIGS. 5A to 5C. FIGS. 4A to 4D and FIGS. 5A to 5C are top views each showing a tip end part of the sample holder according to the first embodiment. The holding rod 002 and the first pulley 015 are not illustrated. It is assumed that the first rotational jig 006 and the second rotational jig 009 are directed in the X direction, and the first pin 016 and the second pin 017 are located on the center line (first rotational axis RA1) of the sample holder 100A in the initial state as shown in FIG. 4A. When the first pulley 015 is rotated counterclockwise, the second rotational jig 009 is rotated clockwise with the second gear shaft 011 as a rotational axis by the second pin 017 inserted into the V-shaped groove 021 of the second rotational jig 009. As a result, the first rotational jig 006 is slid in the −Y direction (FIG. 4B). When the second pin 017 is separated from the V-shaped groove 021, the slide of the first rotational jig 006 stops. Further, when the first pulley 015 is rotated counterclockwise, the first pin 016 reaches an end part of the first pin traveling long hole 014, and the third gear 012 is rotated counterclockwise (FIG. 4C). The rotation of the third gear 012 is transmitted to the second gear 010 and the first gear 007, and the first rotational jig 006 is rotated counterclockwise with the first gear shaft 008 as a rotational axis. When the center axis (the long axis of the column-shaped sample 003) of the needle stage 004 is inclined by +45° relative to the X-axis, the rotation of the first pulley 015 is stopped (FIG. 4D). In the state of FIG. 4D, the sample 003 is rotated from −180° to +180° around the first rotational axis RA1 by the first rotation control unit.

Figure 5A:
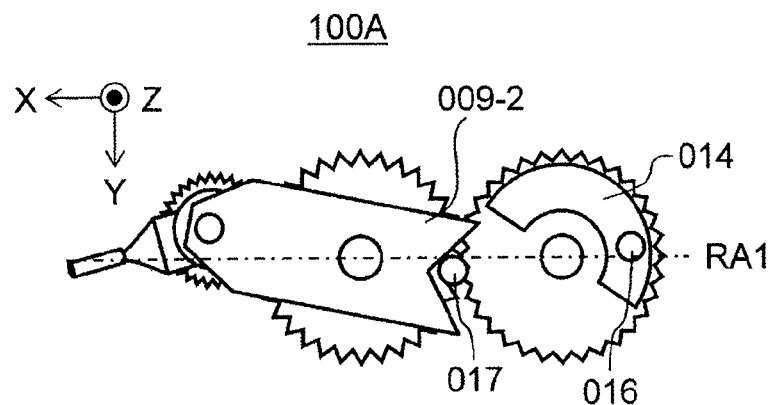
FIGS. 5A to 5C are explanatory diagrams each showing the movement of each part of the sample holder according to the first embodiment.
Figure 5B:
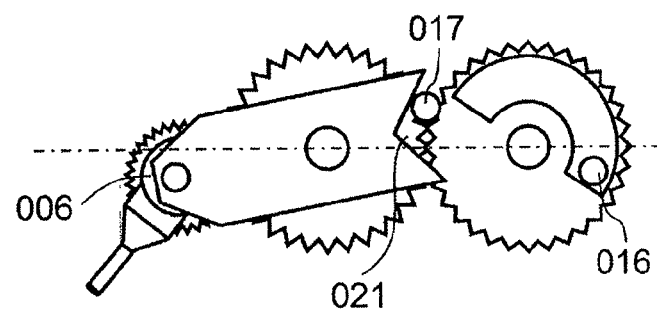
Figure 5C:
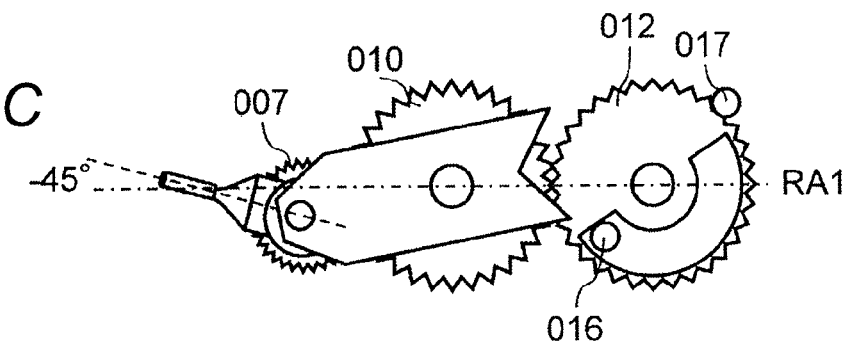

Next, the first pulley 015 is rotated clockwise. The second pin 017 that is similarly rotated clockwise is inserted into the V-shaped groove 021 of the second rotational jig 009 (FIG. 5A). Further, when the first pulley 015 is rotated, the second rotational jig 009 is rotated counterclockwise with the second gear shaft 011 as a rotational axis by the second pin 017. As a result, the first rotational jig 006 is slid in the +Y direction (FIG. 5B). When the second pin 017 is separated from the V-shaped groove 021, the slide of the first rotational jig 006 stops. Further, when the first pulley 015 is rotated clockwise, the first pin 016 reaches an end part of the first pin traveling long hole 014, and the third gear 012 is rotated clockwise. The rotation of the third gear 012 is transmitted to the second gear 010 and the first gear 007, and the first rotational jig 006 is rotated clockwise with the first gear shaft 008 as a rotational axis. When the center axis of the needle stage 004 is inclined by −45° relative to the X-axis, the rotation of the first pulley 015 is stopped (FIG. 5C). In the state of FIG. 5C, the sample 003 is rotated from −180° to +180° around the first rotational axis RA1 by the first rotation control unit.

Figure 15:
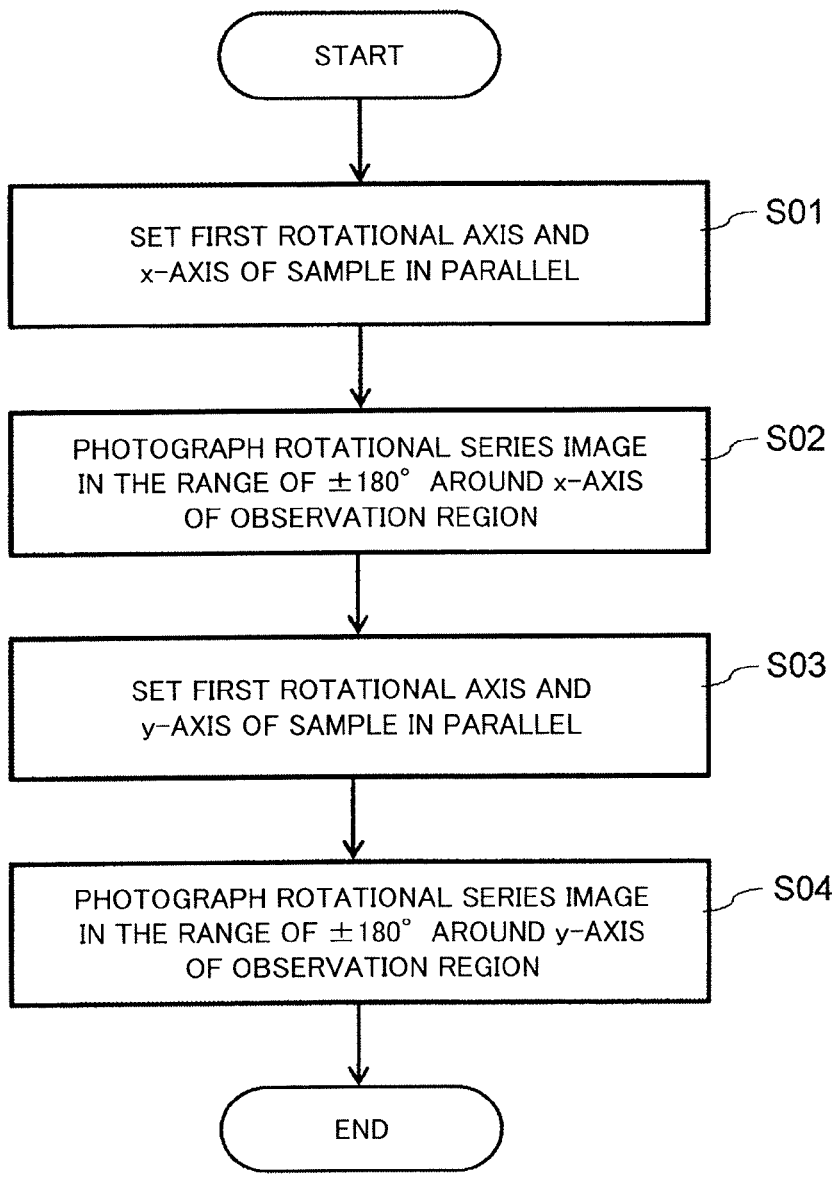
FIG. 15 is a flow diagram for explaining a photographing procedure in a charged particle beam apparatus using the sample holder according to the first embodiment.

Finally, a photographing procedure will be described using FIGS. 4A to 4D, FIGS. 5A to 5C, and FIG. 15. FIG. 15 is a flow diagram for explaining a photographing procedure in a charged particle beam apparatus using the sample holder according to the first embodiment. The photographing procedure (observation method) is configured using 4 steps. (a) The first rotational axis orthogonal to the charged particle beam axis is set in parallel to the x-axis of the sample (Step S01). (b) The rotational series image from −180° to +180° around the x-axis of the observation region is photographed using the first rotation angle control unit (Step S02). (c) The first rotational axis is set in parallel to the y-axis of the sample (Step S03). (d) The rotational series image from −180° to +180° around the y-axis of the observation region is photographed using the first rotation angle control unit (Step S04).

First, the procedure (Step S01) of (a) will be described in detail. The procedure starts from a state in which the sample 003 is mounted in the sample holder 100A. As shown in FIG. 4A to FIG. 4D, an angle formed by the long axis (the long axis of the column-shaped sample 003) of the needle stage 004 and the first rotational axis RA1 is set to be about +45° using the linear movement transmission mechanism PT and the rotational movement transmission mechanism RO, and the sample 003 is moved substantially on the first rotational axis RA1. Thereafter, the sample holder 100A is inserted into the sample chamber. The position of the sample 003 in the sample chamber is confirmed. First, the second rotational axis RA2 is adjusted as parallel as possible to the charged particle beam optical axis. The xyz direction fixed to the sample 003 thus adjusted substantially matches the XYZ direction fixed to the housing. It should be noted that if the transmission images of the sample 003 in this case are photographed at several magnifications, the images can be used later when confirming that the y-axis of the sample 003 is set as parallel as possible to the first rotational axis RA1. It should be noted that the sample holder 100A may be inserted into the sample chamber at any timing among FIG. 4A to FIG. 4D of the sample holder 100A after the sample 003 is inserted into the sample holder 100A.

Further, the procedure (Step S02) of (b) will be described in detail. The holding rod 002 is rotated around the first rotational axis RA1 using the first rotation angle control unit, and the rotational series image is photographed from −180° to +180° around the x-axis of the observation region. For example, the holding rod 002 is rotated around the first rotational axis RA1 by every 10°, and the sample 003 is photographed each time to obtain 36 rotational series images.

Next, the procedure (Step S03) of (c) will be described in detail. While the sample holder 100A is inserted in the sample chamber, an angle formed by the long axis (the long axis of the column-shaped sample 003) of the needle stage 004 and the first rotational axis RA1 is set to be about −45° using the linear movement transmission mechanism PT and the rotational movement transmission mechanism RO, and the sample 003 is moved substantially on the first rotational axis RA1 as shown in FIG. 5A to FIG. 5C. After the position of the sample 003 in the sample chamber is confirmed, the second rotational axis RA2 is adjusted as parallel as possible to the charged particle beam optical axis as similar to Step S03. Then, the y-axis of the sample 003 is fine-tuned as parallel as possible to the first rotational axis RA1 using the rotational movement transmission mechanism RO. In the fine tuning, the rotation angle of an image photographed in the current setting is measured in an image process using the image photographed in Step S01 as a reference image, and the rotation angle of the first rotational jig 006 in Step S03 is adjusted to be 90° relative to the first rotational jig 006 in the state of Step S01.

The procedure (Step S04) of (d) will be described in detail. The holding rod 002 is rotated around the first rotational axis RA1 using the first rotation angle control unit, and the rotational series image from −180° to +180° around the y-axis of the observation region is photographed. As similar to Step S02, for example, the holding rod 002 is rotated around the first rotational axis RA1 by every 10°, and the sample 003 is photographed each time to obtain 36 rotational series images.

It should be noted that the photographing procedure may be carried out in the order of Step S03, Step S04, Step S01, and Step S02.

A three-dimensional magnetic field structure is reconfigured using the technique described in "Ultramicroscopy, Vol. 108, (2008) 503-513, C. Phatak, M. Beleggia and M. De Graef" from the obtained rotational series images around the x-axis and the y-axis of the observation region.

According to embodiment, the mechanism of linearly moving the first rotational jig is provided in the sample holder, and thus it is not necessary to modify the stage on which the sample holder is mounted. It is not necessary to secure an additional space in the sample holder as in Japanese Unexamined Patent Application Publication No. 2013-149507 or WO2013/108711. Further, according to the embodiment, when the rotational series image around the x-axis and the rotational series image around the y-axis are obtained, a series of observations can be carried out without exposing the sample to the atmosphere. In the case where the sample is taken out during the observation, the charged particle beam apparatus is stopped to take out the sample. Then, the apparatus needs to be operated again after the sample is inserted again. However, it is not necessary to take out the sample during the observation in the embodiment. As a result, it is possible to significantly shorten the time required for an observation in an electromagnetic field structure analysis. Further, it is possible to observe a sample whose material characteristics are changed due to oxidation by being exposed to the atmosphere during the observation. Further, even in the case where the sample is observed while cooling or heating the same, it is not necessary to take out the sample to the atmosphere after the temperature returns to the room temperature. Thus, the observation time can be significantly shortened, and it is not necessary to consider changes in material characteristics due to changes of temperature. As a result, the observation target of the sample can be expanded.

Further, using the sample holder according to the first embodiment, the sample can be rotated from −180° to +180° around the first rotational axis RA1, and can be rotated from about −90° to +90° around the second rotational axis in the direction orthogonal to the first rotational axis. Specifically, the sample can be observed from any direction in a hemisphere. If the sample holder according to the first embodiment is applied to not only a transmission electron microscope, but also a scanning electron microscope, the detailed solid shape of the sample can be obtained.

Second Embodiment

In the first embodiment, the two pins and the pulley are used as the power separator, and the parts can be relatively easily processed. A second embodiment of a sample holder shows an example using two intermittent gears and a pulley as the power separator.

Figure 6:
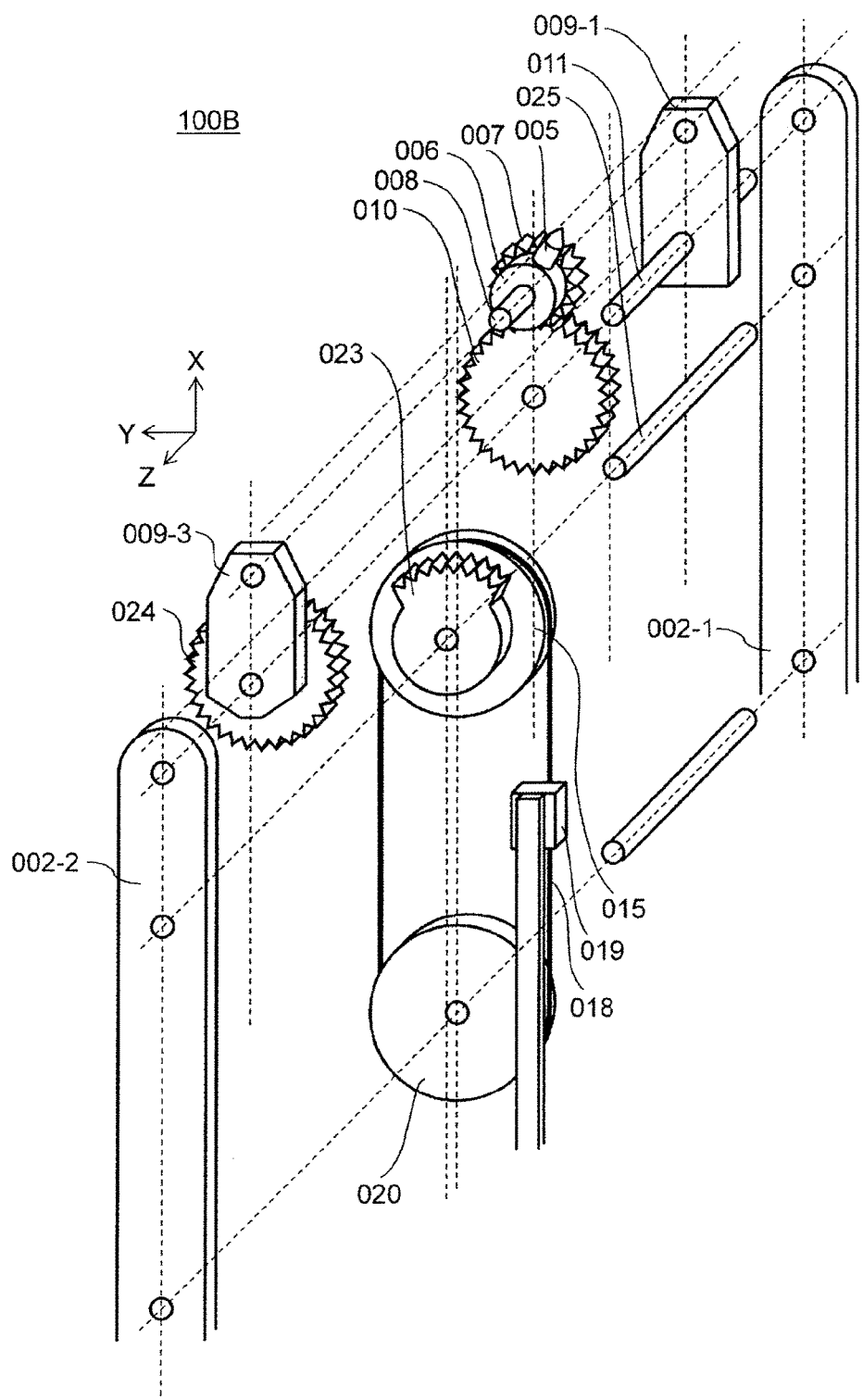
FIG. 6 is a configuration diagram of a tip end part of a sample holder according to a second embodiment.
Figure 7:
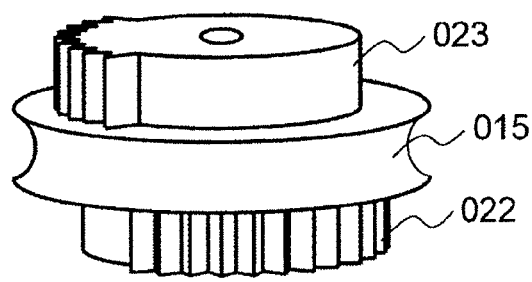
FIG. 7 is a configuration diagram of a power separator according to the second embodiment.

The second embodiment will be described using FIG. 6 and FIG. 7. FIG. 6 is a configuration diagram of a tip end part of a sample holder according to the second embodiment. FIG. 7 is an enlarged view of two intermittent gears and the first pulley 015 corresponding to the power separator of the sample holder according to the second embodiment. A first intermittent gear 022 is attached to the lower side (first surface) of the rotational surface of the first pulley 015 of a sample holder 100B according to the second embodiment, and a second intermittent gear 023 is attached to the upper side (second surface) thereof. The first pulley 015, the first intermittent gear 022, and the second intermittent gear 023 correspond to the power separator. The first intermittent gear 022 and the second intermittent gear 023 are fixed to the first pulley 015, and can be rotated with a first pulley shaft 025 as a rotational axis. The rotation of the first pulley 015 rotates the first intermittent gear 022. The teeth of the first intermittent gear 022 are meshed with the second gear 010. When the first intermittent gear 022 is rotated and the teeth of the first intermittent gear 022 are meshed with the second gear 010, the rotation of the first intermittent gear 022 is transmitted to the second gear 010. In the toothless region of the first intermittent gear 022, the rotation of the first intermittent gear 022 is not transmitted to the second gear 010. The rotation of the second gear 010 is transmitted to the first gear 007 to rotate the first rotational jig 006.

The second rotational jig 009 includes parts 009-1 and 009-3 and a fourth gear 024. The fourth gear 024 is fixed to a part 009-3 of the second rotational jig 009, and can be rotated with the second gear shaft 011 as a rotational axis. The rotation of the first pulley 015 rotates the second intermittent gear 023. The teeth of the second intermittent gear 023 are meshed with the fourth gear 024. When the second intermittent gear 023 is rotated and the teeth of the first intermittent gear 023 are meshed with the fourth gear 024, the rotation of the second intermittent gear 023 is transmitted to the fourth gear 024. In the toothless region of the second intermittent gear 023, the rotation of the second intermittent gear 023 is not transmitted to the fourth gear 024. When the second rotational jig 009 is rotated by the second intermittent gear 023, the first rotational jig 006 is slid in the Y direction.

Each timing of the rotation of the first rotational jig 006 and the slide of the first rotational jig 006 can be determined on the basis of the lengths of the toothless regions of the first intermittent gear 022 and the second intermittent gear 023 and the arrangements thereof on the first pulley 015.

The detailed movement of the first rotational jig 006 is the same as that in the first embodiment, and thus the explanation of the photographing (observing) procedure and the like will be omitted.

Third Embodiment

In the first embodiment, an example of the linear movement of the slide rod is shown as power input to the power separator. A third embodiment of a sample holder shows an example in which the rotational movement is input into the power separator. Since no wire is used, there is no possibility of wire cut. In addition, the wire and the pulley are not slid, and thus the reproducibility of the operation is improved.

Figure 8:
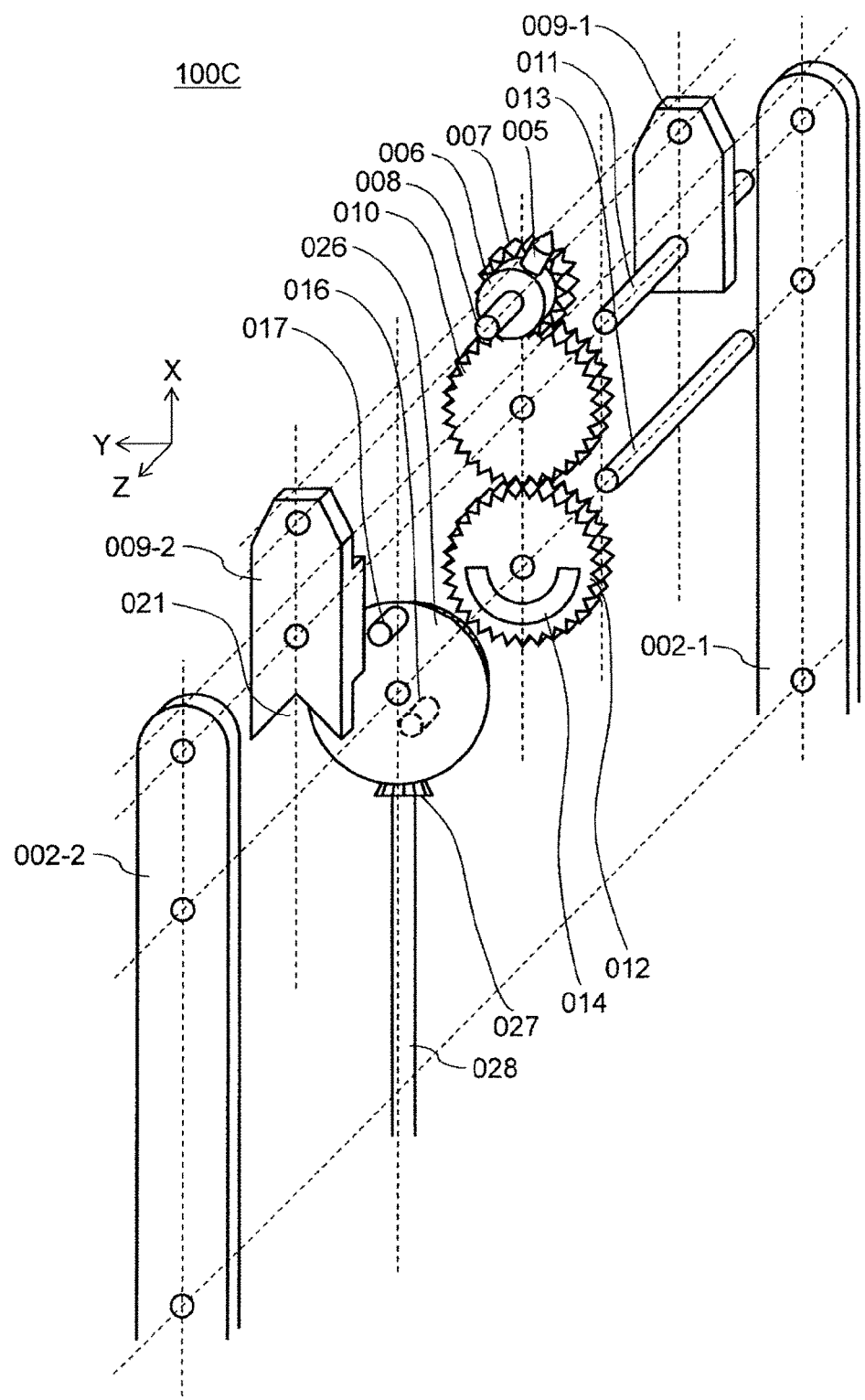
FIG. 8 is a configuration diagram of a tip end part of a sample holder according to a third embodiment.
Figure 9:
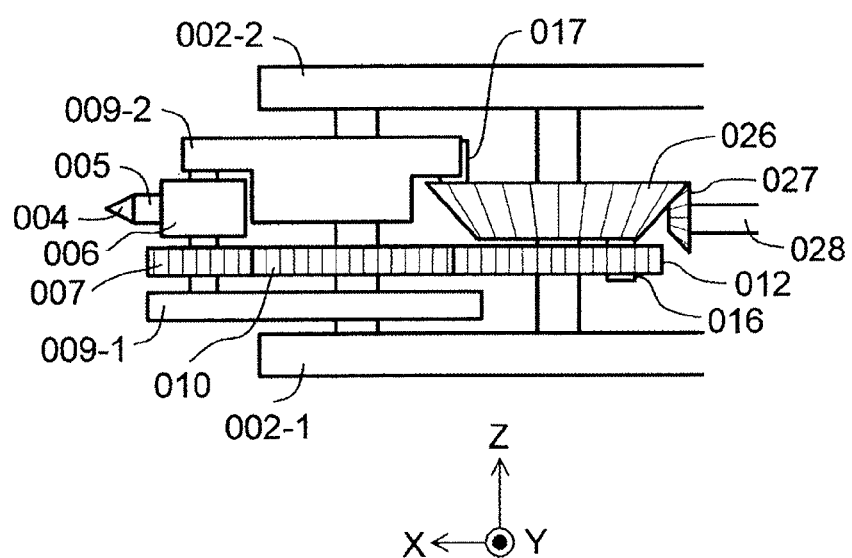
FIG. 9 is a side view of a tip end part of the sample holder according to the third embodiment.

The third embodiment will be described using FIG. 8 and FIG. 9. FIG. 8 is a configuration diagram of a tip end part of a sample holder according to the third embodiment. FIG. 9 is a side view of the tip end part of the sample holder according to the third embodiment. The power separator of a sample holder 100C according to the third embodiment is configured using a first bevel gear (rotor) 026, the first pin 016, and the second pin 017. The power input into the power separator is the rotational movement of a second bevel gear shaft 028. A second bevel gear 027 is attached to a tip end of the second bevel gear shaft 028, and the rotation of the second bevel gear shaft 028 rotates the first bevel gear 026.

The first pin 016 is attached to the lower side of the rotational surface of the first bevel gear 026, and the second pin 017 is attached to the upper side thereof. The roles of the first pin 016 and the second pin 017, and the movement of each part are the same as those in the first embodiment, and thus the explanation of the photographing procedure and the like will be omitted.

Fourth Embodiment

In the third embodiment, an example of the rotational movement of the bevel gear shaft is shown as power input to the power separator. A fourth embodiment of a sample holder shows another example in which the rotational movement is input into the power separator.

Figure 10:
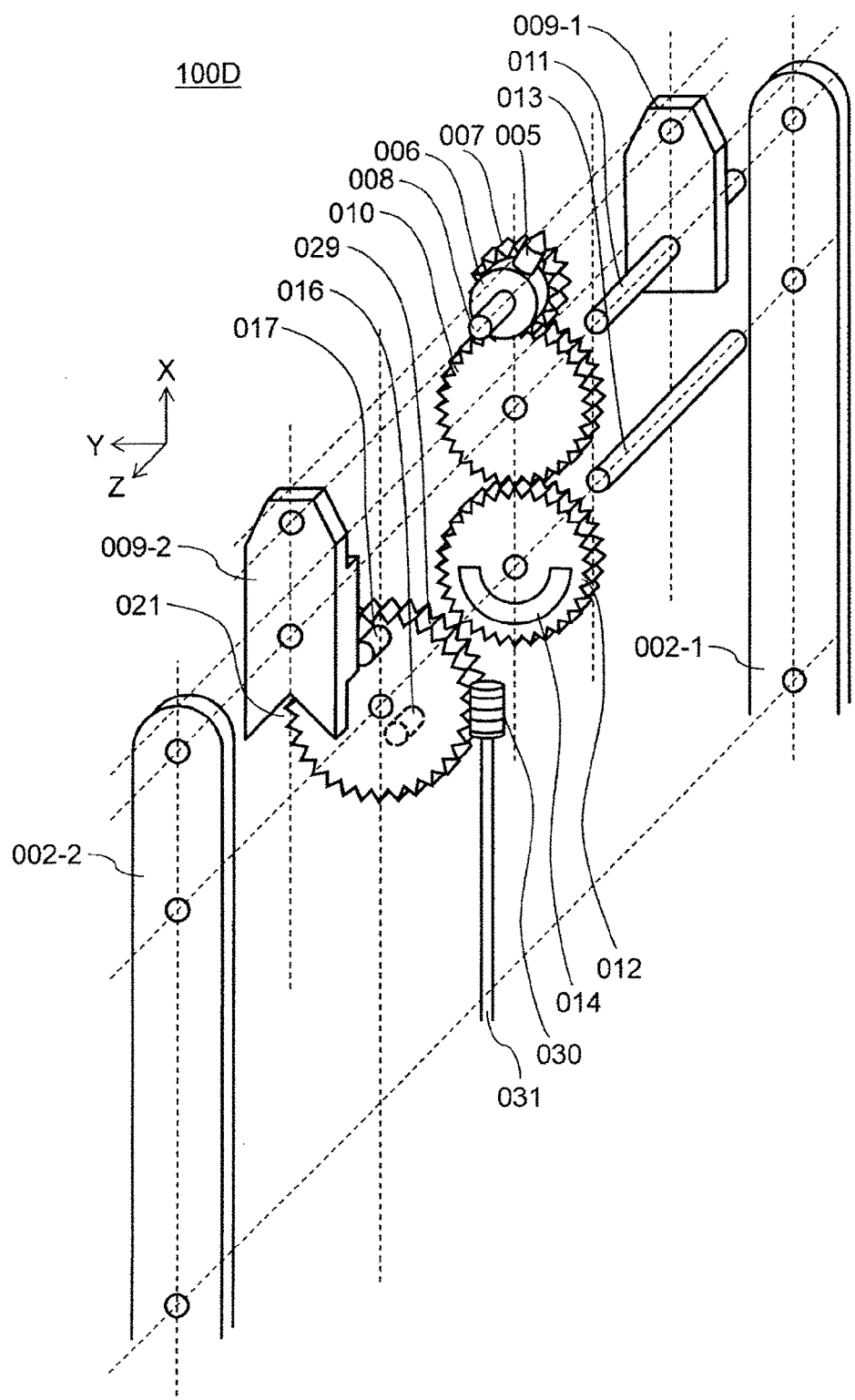
FIG. 10 is a configuration diagram of a tip end part of a sample holder according to a fourth embodiment.

The fourth embodiment will be described using FIG. 10. FIG. 10 is a configuration diagram of a tip end part of a sample holder according to the fourth embodiment. The power separator of a sample holder 100D according to the fourth embodiment is configured using a gear with pins 029, the first pin 016, and the second pin 017. The power input into the power separator is the rotational movement of a worm wheel shaft 031. A worm wheel 030 is attached to a tip end of the worm wheel shaft 031, and the rotation of the worm wheel shaft 031 rotates the gear with pins 029.

The first pin 016 is attached to the lower side of the rotational surface of the gear with pins 029, and the second pin 017 is attached to the upper side thereof. The roles of the first pin 016 and the second pin 017, and the movement of each part are the same as those in the first embodiment, and thus the explanation of the photographing procedure and the like will be omitted.

Fifth Embodiment

A fifth embodiment of a sample holder shows an example in which the second embodiment of the power separator using the intermittent gear is combined with the third embodiment in which the rotational movement of the bevel gear shaft is input to the power separator.

Figure 11:
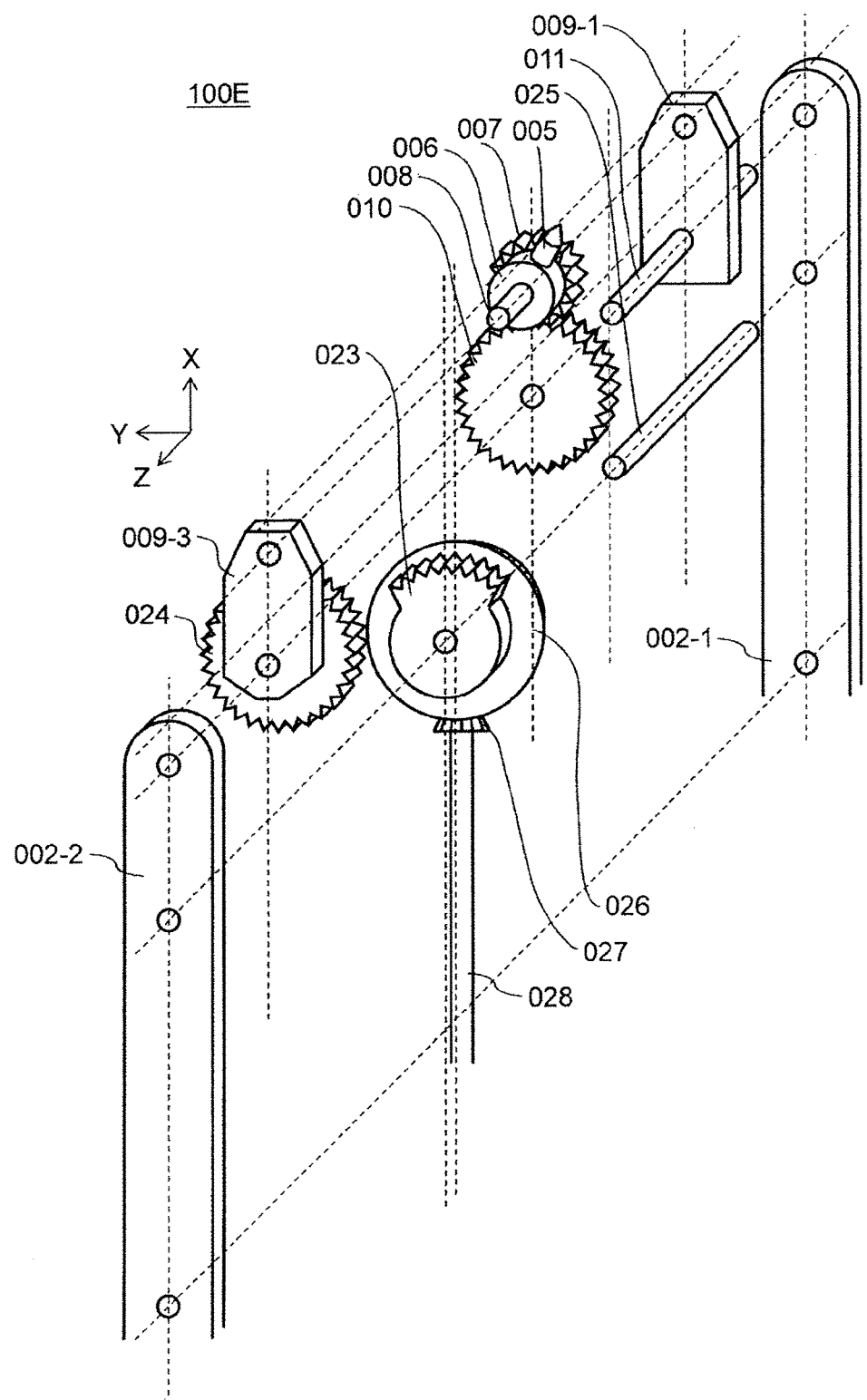
FIG. 11 is a configuration diagram of a tip end part of a sample holder according to a fifth embodiment.

The fifth embodiment will be described using FIG. 11. FIG. 11 is a configuration diagram of a tip end part of a sample holder according to the fifth embodiment. The power separator of a sample holder 100E according to the fifth embodiment is configured using the first bevel gear 026, the first intermittent gear 022, and the second intermittent gear 023. The first intermittent gear 022 is hidden behind the first bevel gear 026, and thus is not illustrated.

The power input into the power separator is the rotational movement of the second bevel gear shaft 028. The second bevel gear 027 is attached to a tip end of the second bevel gear shaft 028, and the rotation of the second bevel gear shaft 028 rotates the first bevel gear 026.

The first intermittent gear 022 is attached to the lower side of the rotational surface of the first bevel gear 026, and the second intermittent gear 023 is attached to the upper side thereof. The first intermittent gear 022 and the second intermittent gear 023 are fixed to the first bevel gear 026, and can be rotated with the first pulley shaft 025 as a rotational axis. The roles of the first intermittent gear 022 and the second intermittent gear 023, and the movement of each part are the same as those in the second embodiment, and thus the explanation of the photographing procedure and the like will be omitted.

Sixth Embodiment

A sixth embodiment of a sample holder shows an example in which the second embodiment of the power separator using the intermittent gear is combined with the fourth embodiment in which the rotational movement of the worm gear is input to the power separator.

Figure 12:
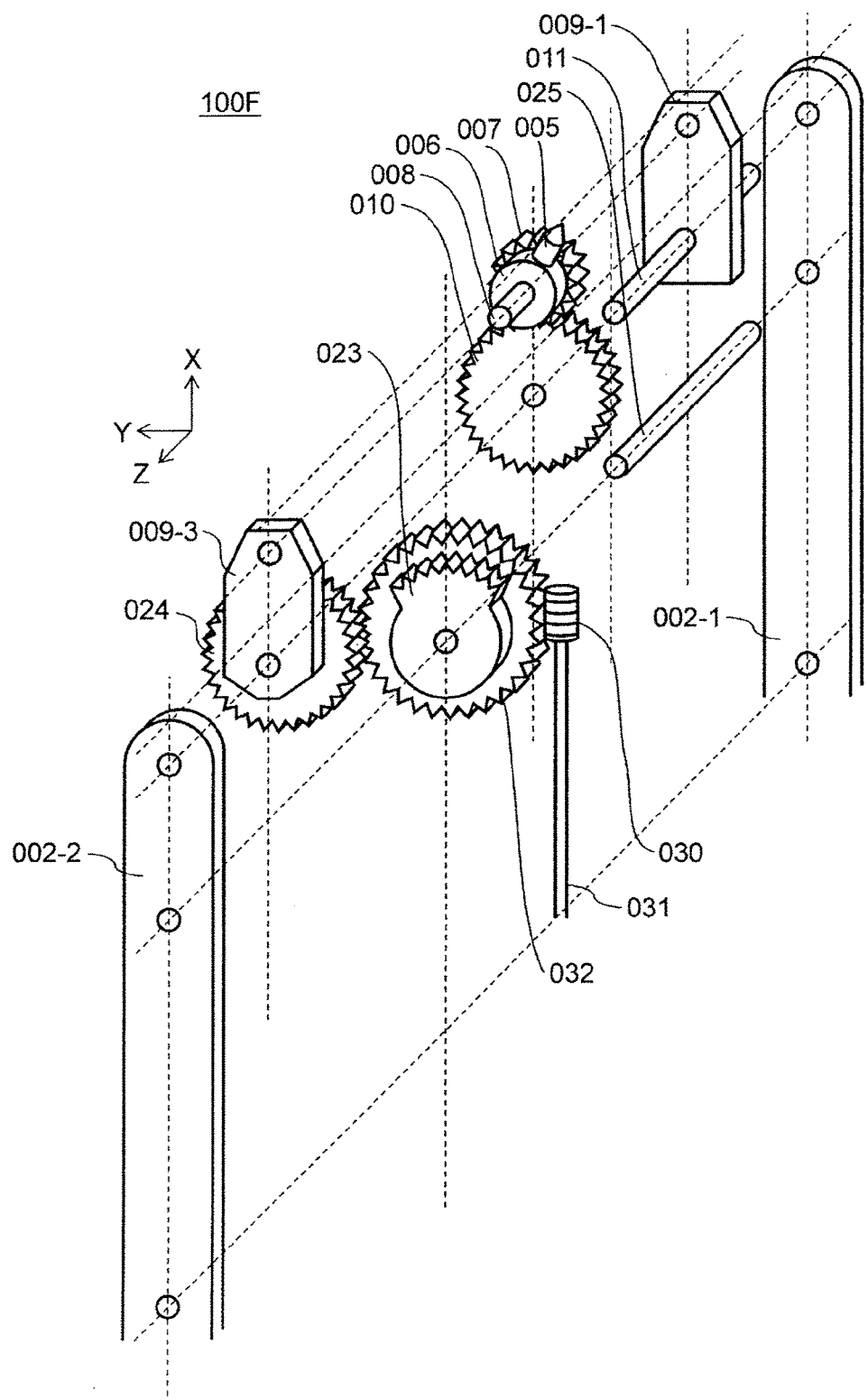
FIG. 12 is a configuration diagram of a tip end part of a sample holder according to a sixth embodiment.

The sixth embodiment will be described using FIG. 12. FIG. 12 is a configuration diagram of a tip end part of a sample holder. The power separator of a sample holder 100F according to the sixth embodiment is configured using a fifth gear (rotor) 032, the first intermittent gear 022, and the second intermittent gear 023. The first intermittent gear 022 is hidden behind the fifth gear 032, and thus is not illustrated.

The power input into the power separator is the rotational movement of the worm wheel shaft 031. The worm wheel 030 is attached to a tip end of the worm wheel shaft 031, and the rotation of the worm wheel shaft 031 rotates the fifth gear 032.

The first intermittent gear 022 is attached to the lower side of the rotational surface of the fifth gear 032, and the second intermittent gear 023 is attached to the upper side thereof. The first intermittent gear 022 and the second intermittent gear 023 are fixed to the fifth gear 032, and can be rotated with the first pulley shaft 025 as a rotational axis. The roles of the first intermittent gear 022 and the second intermittent gear 023, and the movement of each part are the same as those in the second embodiment, and thus the explanation of the photographing procedure and the like will be omitted.

Seventh Embodiment

In the second embodiment, two intermittent gears are used for the power separator. A seventh embodiment of a sample holder shows an example of no toothless region of the intermittent gear.

Figure 13A:
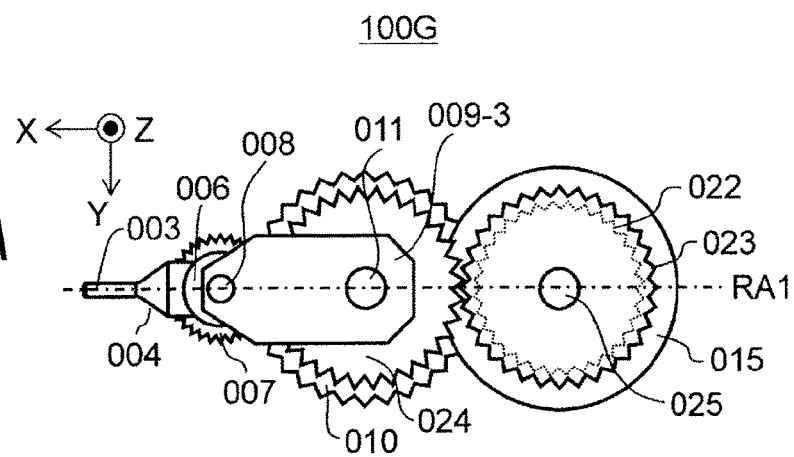
FIGS. 13A to 13C are explanatory diagrams each showing the movement of each part of a sample holder according to a seventh embodiment.
Figure 13B:
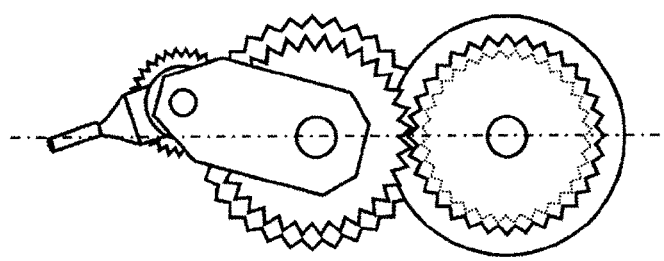
Figure 13C:
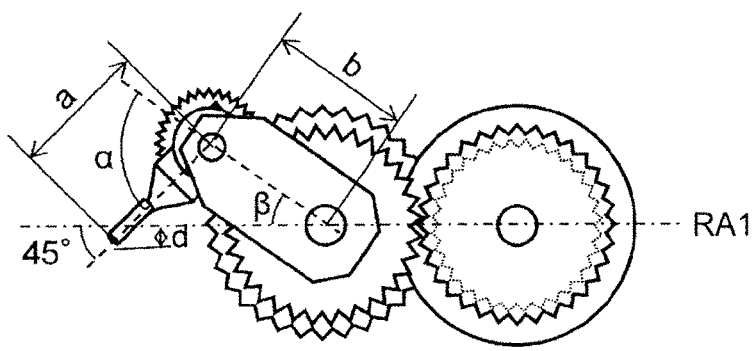

The seventh embodiment will be described using FIGS. 13A to 13C. FIGS. 13A to 13C are top views each showing a tip end part of a sample holder 100G according to the seventh embodiment for showing the movement of each part. In the embodiment, the first intermittent gear 022 and the second intermittent gear 023 have no toothless regions, but are referred to as intermittent gears for the convenience.

When the first pulley 015 is rotated counterclockwise, the second intermittent gear 023 is also rotated counterclockwise. As a result, the fourth gear 024 meshed with the second intermittent gear 023 is rotated clockwise with the second gear shaft 011 as a rotational axis. Since the part 009-3 is fixed to the fourth gear 024, the second rotational jig 009 is rotated clockwise with the second gear shaft 011 as a rotational axis.

On the other hand, when the first pulley 015 is rotated counterclockwise, the first intermittent gear 022 is also rotated counterclockwise. As a result, the second gear 010 meshed with the first intermittent gear 022 is rotated clockwise with the second gear shaft 011 as a rotational axis. Further, the first gear 007 meshed with the second gear 010 is rotated counterclockwise with the first gear shaft 008 as a rotational axis. The first rotational jig 006 on which the sample 003 is mounted is fixed to the first gear 007, and thus is rotated counterclockwise with the first gear shaft 008 as a rotational axis (FIG. 13B).

When the first pulley 015 is further rotated counterclockwise and the sample 003 is inclined by 45° relative to the state of FIG. 13A, the rotation of the first pulley 015 is stopped (FIG. 13C). In this state, the sample 003 is rotated from −180° to +180° around the first rotational axis RA1, and the rotational series image around the x-axis of the observation region is obtained.

Next, the first pulley 015 is further rotated clockwise to form a state line-symmetric with respect to the first rotational axis RA1 of FIG. 13C. In this state, the sample 003 is rotated from −180° to +180° around the first rotational axis RA1, and the rotational series image around the y-axis of the observation region is obtained.

In the case where the toothless regions of the intermittent gears are eliminated, the first rotational jig 006 and the second rotational jig 009 are simultaneously rotated together with the rotation of the first pulley 015. It is assumed that a rotation angle of the first rotational jig 006 relative to the center axis of the second rotational jig 009 is $\alpha$ and a rotation angle of the second rotational jig 009 relative to the first rotational axis RA1 is $\beta$. Further, it is assumed that a distance from the first gear shaft 008 to the tip end of the sample 003 is a and a distance from the second gear shaft 011 to the first gear shaft 008 is b.

Along with the inclination of the sample 003, the tip end of the sample 003 is separated from the first rotational axis RA1. The amount of deviation in the Y-axis direction is represented as follows.

$$d = b \times \sin\beta - a \times \sin(\alpha - \beta) \quad (1)$$

In order for the tip end of the sample 003 to exist on the first rotational axis RA1 in the state ($\alpha-\beta=45°$) of FIG. 13C, d=0 is satisfied, and thus Equation 1 is changed as follows.

$$\beta=\arcsin(a\times\sin 45°/b) \quad (2)$$

On the assumption that the gear ratio of the gears is adjusted so that the rotation angle $\alpha$ becomes n times the rotation angle $\beta$, $\alpha=n\beta$ is satisfied. Thus, in the state of FIG. 13C, the following equation is satisfied.

$$\alpha-\beta=n\beta-\beta=45° \quad (3)$$

Thus, if Equation 2 is assigned to Equation 3, the following equation is satisfied.

$$n=45°/\beta+1=45°/\arcsin(a\times\sin 45°/b)+1 \quad (4)$$

For example, in the case of a=2 mm and b=3 mm, if the gear ratio of the gears is adjusted so that the rotation angle $\alpha$ becomes 2.6 times the rotation angle $\beta$, the tip end of the sample 003 can be disposed on the first rotational axis when the sample 003 is inclined by 45°. It should be noted that it is not necessary to dispose the tip end of the sample 003 on the first rotational axis. It is only necessary to dispose the sample 003 in the observation region.

The invention achieved by the inventors has been concretely described above on the basis of the embodiments. However, it is obvious that the present invention is not limited to the above-described embodiments, but can be variously changed.

For example, the sample holder according to each of the first embodiment to the seventh embodiment may be configured upside down. Specifically, the sample holder may be inserted upside down into the sample chamber, or some parts of the sample holder may be configured upside down.

What is claimed is:

1. A sample holder comprising:
   a first rotational jig to a tip end part of which a charged-particle-beam-irradiated sample is attached;
   a power separator that separates one input movement into two movements;
   a holding rod that holds the power separator;
   a linear movement transmission mechanism that transmits power generated from the power separator and provides the first rotational jig with a linear movement;
   a rotational movement transmission mechanism that transmits the power generated from the power separator and provides the first rotational jig with a rotational movement;
   a power unit that provides the power separator with a movement; and
   a first rotation control unit that provides the first rotational jig with a first rotation using an extending direction of the holding rod as a rotational axis,
   wherein the power separator includes: a rotor; a first pin attached to a first surface of a rotational surface of the rotor; and a second pin attached to a second surface opposite to the first surface, and the input movement is converted into the rotational movement of the rotor, and
   wherein the power separator adjusts the position of the first pin, the position of the second pin, and a length of the first pin traveling long hole to control a movement phase between the linear movement and the rotational movement of the first rotational jig.

2. The sample holder according to claim 1, wherein the rotational movement transmission mechanism includes: a first gear having a first pin traveling long hole into which the first pin is inserted; and a second gear that transmits the rotation of the first gear to the first rotational jig, and the first rotational jig is rotationally moved by the first pin.

3. The sample holder according to claim 1, wherein the linear movement transmission mechanism includes: a V-shaped groove that accepts the second pin at one end; and a second rotational jig that holds the first rotational jig at the opposite end, and the second rotational jig is rotated by the second pin so that the first rotational jig is linearly moved.

4. A sample holder comprising:
   a first rotational jig to a tip end part of which a charged-particle-beam-irradiated sample is attached;
   a power separator that separates one input movement into two movements;
   a holding rod that holds the power separator;
   a linear movement transmission mechanism that transmits power generated from the power separator and provides the first rotational jig with a linear movement;
   a rotational movement transmission mechanism that transmits the power generated from the power separator and provides the first rotational jig with a rotational movement;
   a power unit that provides the power separator with a movement; and
   a first rotation control unit that provides the first rotational jig with a first rotation using an extending direction of the holding rod as a rotational axis,
   wherein the power separator includes: a rotor; a first intermittent gear attached to a first surface of a rotational surface of the rotor; and a second intermittent gear attached to a second surface opposite to the first surface, and the input movement is converted into the rotational movement of the rotor.

5. The sample holder according to claim 4, wherein the rotational movement transmission mechanism includes a second gear that transmits the rotation of the first intermittent gear to the first rotational jig, and the first intermittent gear is rotated so that the first rotational jig is rotationally moved.

6. The sample holder according to claim 4, wherein the linear movement transmission mechanism includes a second rotational jig that holds a fourth gear, and the second rotational jig is rotated by the second intermittent gear so that the first rotational jig is linearly moved.

7. The sample holder according to claim 4, wherein the power separator adjusts the lengths and positions of toothless regions of the first intermittent gear and the second intermittent gear to control a movement phase between the linear movement and the rotational movement of the first rotational jig.

8. A charged particle beam apparatus comprising:
   an irradiation unit that irradiates a charged particle beam onto a sample; and
   a sample holder that sets the position and angle of the sample relative to the charged particle beam,
   wherein the sample holder includes:
   a first rotational jig to a tip end part of which the sample is attached;
   a power separator that separates one input movement into two movements;
   a holding rod that holds the power separator;
   a linear movement transmission mechanism that transmits power generated from the power separator and provides the first rotational jig with a linear movement;

a rotational movement transmission mechanism that transmits the power generated from the power separator and provides the first rotational jig with a rotational movement;

a power unit that provides the power separator with a movement; and a first rotation control unit that provides the first rotational jig with a first rotation using the extending direction of the holding rod as a rotational axis, wherein the power separator includes: a rotor; a first pin or a first intermittent pear attached to a first surface of a rotational surface of the rotor; and a second pin or a second intermittent gear attached to a second surface opposite to the first surface, and the input movement is converted into the rotational movement of the rotor, and wherein the rotational movement transmission mechanism includes: a third pear having a first pin traveling long hole into which the first pin is inserted; and a second gear that transmits the rotation of the third gear to the first rotational jig, and the first rotational jig is rotationally moved by the first pin, or the rotational movement transmission mechanism includes the second gear that transmits the rotation of the first intermittent gear to the first rotational jig, and the first intermittent gear is rotated so that the first rotational jig is rotationally moved.

9. The charged particle beam apparatus according to claim 8, wherein the linear movement transmission mechanism includes: a V-shaped groove that accepts the second pin at one end; and a second rotational jig that holds the first rotational jig at the opposite end, and the second rotational jig is rotated by the second pin so that the first rotational jig is linearly moved, or the linear movement transmission mechanism includes the second rotational jig that holds a fourth gear, and the second rotational jig is rotated by the second intermittent gear so that the first rotational jig is linearly moved.

10. The charged particle beam apparatus according to claim 8, wherein the power separator adjusts the position of the first pin, the position of the second pin, and the length of the first pin traveling long hole to control a movement phase between the linear movement and the rotational movement of the first rotational jig, or the power separator adjusts the lengths and positions of toothless regions of the first intermittent gear and the second intermittent gear to control a movement phase between the linear movement and the rotational movement of the first rotational jig.

* * * * *